United States Patent [19]

Jansson et al.

[11] Patent Number: 5,034,632
[45] Date of Patent: Jul. 23, 1991

[54] HIGH SPEED TTL BUFFER CIRCUIT AND LINE DRIVER

[75] Inventors: Lars G. Jansson, Long Island; Michael G. Ward, Saco, both of Me.

[73] Assignee: National Semiconductor Corporation, Santa Clara, Calif.

[21] Appl. No.: 540,641

[22] Filed: Jun. 19, 1990

[51] Int. Cl.⁵ .................... H03K 19/003; H03K 19/20
[52] U.S. Cl. ..................................... 307/456; 307/475
[58] Field of Search ............. 307/443, 475, 456, 549, 307/551, 559, 560, 300

[56] References Cited

U.S. PATENT DOCUMENTS

| | | | |
|---|---|---|---|
| 4,644,186 | 2/1987 | Sivasothy et al. | 307/300 |
| 4,740,719 | 4/1988 | Taki | 307/456 |
| 4,745,308 | 5/1988 | Neely | 307/456 |
| 4,839,538 | 6/1989 | Curtis | 307/549 |
| 4,855,622 | 8/1989 | Johnson | 307/456 |
| 4,988,898 | 1/1991 | Jansson | 307/475 |
| 4,988,899 | 1/1991 | Jansson | 307/475 |

FOREIGN PATENT DOCUMENTS 0130624  5/1989  Japan ................................. 307/456

Primary Examiner—David Hudspeth
Assistant Examiner—Andrew Sanders
Attorney, Agent, or Firm—Lee Patch; James W. Rose; Daniel H. Kane

[57] ABSTRACT

A non-inverting TTL buffer circuit provides an input for receiving data signals at high and low potential levels and an output for transmitting data signals in phase with the input. The base node of an emitter follower transistor element is coupled to a collector node of the input transistor circuit in an inverting coupling. The emitter node is coupled to a base node of the phase splitter transistor element for sourcing base driven current to the phase splitter transistor element in response to data signals at the input. The emitter follower provides transient "overdrive" for fast turn on of the phase splitter. A first clamp circuit between the base node of the emitter follower transistor element and the low potential power rail clamps the base node at a low potential level when the emitter follower transistor element is relatively non-conducting and establishes the input threshold voltage level. A second clamp circuit coupled to the base node of the emitter follower transistor element clamps the base node at a high potential level for limiting base drive current to the phase splitter transistor element from the emitter follower transistor element. The second clamp circuit limits saturation of the phase splitter transistor element and improves switching speed. The second clamp circuit is preferably coupled between the base node of the emitter follower transistor element and a collector node of the phase splitter transistor element and includes a "programmable" resistor voltage drop component for limiting operation of the phase splitter transistor element to the desired operating region.

31 Claims, 6 Drawing Sheets

HIGH SPEED TTL BUFFER CIRCUIT AND LINE DRIVER

CROSS REFERENCE OF RELATED PATENT APPLICATIONS

This patent application is related to the Lars G. Jansson U.S. patent application Ser. No. 450,826, filed 11 Dec. 1989 for HIGH SPEED ECL/CML TO TTL TRANSLATOR WITH TTL GATE CURRENT SOURCE CONTROLLED OVERDRIVE AND CLAMP CIRCUIT which is in turn a Continuation-In-Part (CIP) of U.S. patent application Ser. No. 352,169, filed 15 May 1989, for HIGH SPEED ECL/CML TO TTL TRANSLATOR CIRCUIT. The related patent applications are assigned to a common Assignee.

TECHNICAL FIELD

This invention relates to a new non-inverting or true output TTL buffer circuit, useful for example for TTL output buffer line drivers. The new circuit configuration reduces signal propagation delay, power consumption, and switching induced ground noise. An input threshold hysteresis circuit increases the input noise margin following an input signal low to high potential level transition. A bias circuit reduces temperature dependence. The non-inverting TTL buffer circuit incorporates in a new circuit configuration the overdrive and clamp circuit of the related patent applications.

BACKGROUND ART

A prior art non-inverting TTL buffer circuit useful for example as an output buffer line driver is illustrated in FIG. 1. Data signals at high and low potential levels at the input $V_{IN}$ propagate through the buffer circuit and are transmitted as output data signals at the output $V_{OUT}$ in phase with the input data signals. A pullup circuit provided by Darlington transistor pair Q5, Q6 sources current to the output $V_{OUT}$ from high potential power rail $V_{CC}$ through resistor R5 and diode D8. The pulldown transistor element Q4 sinks current from the output $V_{OUT}$ to the low potential power rail GND. Resistor R6 and Diode D6 provide a leakage path for discharge of the base of pulldown transistor element Q4 when it is not to be conducting. The phase splitter transistor element Q3 controls in opposite phase the conducting states of the pullup and pulldown transistor elements.

The phase splitter transistor element Q3 is an inverting stage. The coupling of the pullup circuit Q5, Q6 to the collector node of the phase splitter Q3 results in an inverted signal at the output $V_{OUT}$. Therefore to provide a non-inverting buffer circuit, a second invertor stage transistor element QB is added to the buffer circuit. The base node of phase splitter Q3 is coupled to the collector node of the invertor stage transistor element QB to provide the second inverting coupling. Base drive current to phase splitter Q3 through resistor RB is controlled by the conducting state of inverting stage transistor element QB. Diode DB provides the emitter current path to low potential power rail GND for transistor element QB. Leakage resistor RG discharges the base of transistor element QB when it is not conducting.

The input circuit of the buffer circuit of FIG. 1 includes the input diode D1 and input transistor element QA. A low potential signal at the input $V_{IN}$ diverts base drive current through resistor R1 away from the base node of input transistor QA turning it off. A high potential signal at the input $V_{IN}$ directs base drive current to turn on the input transistor element QA which in turn conducts base drive current to the invertor stage transistor element QB through resistor RA. Transistor elements QA and QB are therefore conducting in phase with the input data signal. The collector nodes of transistor elements QB and Q3 provide the sequential inverting couplings so that the data signal at the output $V_{OUT}$ is in phase with the input $V_{IN}$.

Another prior art non-inverting buffer circuit is illustrated in FIG. 2 with an added stage of gain. The additional stage of amplification is provided by voltage amplifier stage transistor element QA1 which provides amplified base drive current to the base node of invertor stage transistor element QB through resistor RA1. In the example of FIG. 2, transistors QA, QA1 and QB operate in phase with the input signal at the input $V_{IN}$. Base drive current to the phase splitter transistor element Q3 through resistor RB1 is controlled by the inverting coupling at the collector node of invertor stage transistor element QB through diode DB1. The remaining components performing the functions similar to that in FIG. 1 are indicated by the same reference designations. The circuit of FIG. 2 may be used where additional gain is necessary for example where transistor elements with low $\beta$'s are used.

A disadvantage of the prior art non-inverting buffer circuits of FIGS. 1 and 2 is of course the requirement that additional stages be added for inversion or gain substantially increasing signal propagation delay through the circuits. The additional stages also require increased power consumption. Other operating features of the prior art non-inverting buffer circuits of FIGS. 1 and 2 which it would be desirable to improve include temperature dependence, ground noise, including ground bounce and undershoot, noise margin at the input, switching speed etc.

OBJECTS OF THE INVENTION

It is therefore an object of the present invention to provide a new non-inverting TTL buffer circuit for high speed output buffers and line drivers with reduced signal propagation delay and increased switching speed.

Another object of the invention is to provide non-inverting or true output buffer circuits with operation of the phase splitter switching transistor element within controlled limits for increased switching speed achieved through the new overdrive and clamp circuits of the related patent applications. Additional stages of delay are avoided by coupling the overdrive and clamp circuit directly in an inverting coupling to the input stage.

Further objects of the invention are to provide improved noise margin at the input circuit through a new threshold hysteresis circuit, to reduce temperature dependence at the input through a bias circuit, and to reduce ground bounce and undershoot using the new overdrive and clamp circuit arrangements controlling the phase splitter transistor element.

DISCLOSURE OF THE INVENTION

In order to accomplish these results the invention utilizes the known framework of a TTL buffer circuit having an input for receiving data signals at high and low potential levels and an output for transmitting data signals. A pulldown transistor element is coupled to the output for sinking current from the output to a low potential power rail. A pullup circuit is coupled to the output for sourcing current to the output from a high potential power rail. A phase splitter transistor element is coupled to control in opposite phase the conducting states of the pullup circuit and pulldown transistor element. An input transistor circuit including an input transistor element provides base, collector, and emitter nodes for coupling into the buffer circuit with a base node coupled to the input.

According to the invention the base node of an emitter follower transistor element is coupled to a collector node of the input transistor circuit in an inverting coupling. The emitter node of the emitter follower transistor element is coupled to the base node of the phase splitter transistor element for sourcing base drive current to the phase splitter transistor element in response to data signals at the input.

The invention provides a first clamp circuit defining a first clamp circuit path between the base node of the emitter follower transistor element and the low potential power rail. The first clamp circuit path clamps the base node at a low potential level when the emitter follower transistor element is relatively non-conducting. The first clamp circuit at the same time establishes the input threshold voltage level necessary for switching the input transistor circuit.

The invention also provides a second clamp circuit coupled to the base node of the emitter follower transistor element defining a second clamp circuit path clamping the base node at a high potential level when the emitter follower transistor element is relatively conducting. The second clamp circuit high potential level is selected for limiting base drive current to the phase splitter transistor element from the emitter follower transistor element. The second clamp circuit is preferably an active clamp that controls the base drive current and the saturation level of the phase splitter transistor element. Saturation of the phase splitter transistor element can be limited to the soft saturation operating region, the threshold saturation operating region or even the linear operating region according to the high potential clamping voltage level for improving switching speed of the TTL buffer circuit.

An advantage of this circuit arrangement is that an additional inverting stage is no longer required to achieve a non-inverting data signal output. The additional propagation delay introduced by such an additional stage in conventional circuits is thereby avoided. The emitter follower transistor element driver is instead coupled directly to the collector node of the input transistor element to provide the inverting coupling. The emitter follower transistor element provides initial overdrive of the phase splitter transistor elements for high speed turn on. The clamp circuits constrain operation of the phase splitter transistor element within selected operating limits which avoid deep saturation and permit rapid turn off of the phase splitter transistor element.

In the preferred example embodiment, the input transistor circuit includes an input transistor element, and the first clamp circuit is coupled between an emitter node of the input transistor element and the low potential power rail. The first clamp circuit is therefore coupled to the base node of the emitter follower transistor element through the input transistor element. The first clamp circuit may consist of a plurality of voltage drop components such as first and second diode elements coupled in series between the emitter node of the input transistor element and the low potential power rail establishing the selected input threshold voltage level.

To provide offsetting temperature coefficients the first and second diode elements of the first clamp circuit are selected to be a base collector shorted (BCS) PN junction diode and a Schottky diode. Temperature dependence may be further attenuated by a current source bias circuit coupled to the first clamping circuit and biasing the diode elements. The current source bias circuit maintains a current density level through the diode elements sufficient to reduce the temperature dependence of the voltage drop across the diode elements.

In conventional input circuits, the input switching threshold is normally set by a diode or diode stack. As the input voltage goes through the threshold voltage, the diode stack is biased near the cutoff voltage of the diodes, with low current density and high temperature dependence. The diodes are typically PN junction diodes provided by diode connected transistors that start turning on as the input voltage passes through the threshold voltage. The transistors are therefore switching on from the off state, near cutoff, without saturation, and with low current density at the input threshold voltage. Current through the diode stack is sourced by the input transistor through the collector to emitter path of the input transistor. The input threshold diode stack therefore cannot be "biased up" to a higher current density at the threshold voltage.

According to the present invention, a high current density is maintained in the input threshold diode stack to reduce temperature dependence. However, the additional biasing current is not sourced through the input transistor. Rather, the separate current source bias circuit is coupled between the first clamp circuit threshold diode stack and the high potential power rail.

In the preferred example embodiment the second clamp circuit defines a second clamp circuit path coupled between the base node of the emitter follower transistor element and a collector node of the phase splitter transistor element. In this configuration the second clamp circuit provides a voltage feedback circuit between the emitter follower and the phase splitter transistor element for limiting base drive current to the phase splitter transistor element from the emitter follower transistor element.

The second clamp circuit may consist of first and second diode elements coupled in series between the emitter follower transistor element base node and the phase splitter transistor element collector node. The second clamp circuit components clamp the forward bias across the base to collector junction of the phase splitter transistor element to a level, for example, in the soft saturation operating region thereby avoiding deep saturation.

In the preferred example embodiment the second clamp circuit consists of a selected resistor and a diode element so that the clamping voltage drop and voltage feedback level is "programmable". The voltage drop across the resistor element of this second clamp circuit configuration may be selected for operation of the phase splitter for example in the linear operating region, threshold saturation operating region or soft saturation operating region. The emitter follower transistor element is still controlled through an inverting coupling by the input circuit in the second clamp circuit preferred configuration. However, the voltage at the base node of the emitter follower and therefore the current through the base drive clamp circuit resistor is set by the constant current of a controlled current source circuit also coupled to the base node of the emitter follower transistor element.

By way of example, the current mirror slave branch circuit of a current mirror circuit may be coupled to the base node of the emitter follower transistor element. The current mirror master branch circuit produces a constant current for a non-current switching, constant current, current mirror circuit. This current source circuit configuration provides a controlled current source and a controlled current, setting the initial voltage at the base of the emitter follower transistor element as set forth in the related patent applications. The setting of the controlled current source current level and the reference voltage level at the base of the emitter follower transistor element, and the selection of the resistance value of the resistor in the base drive clamp circuit, "program" the voltage drop across the second clamp circuit and the clamping voltage level for operation of the phase splitter transistor element in the desired operating range.

According to another example of the preferred "programmable" second clamp circuit, a $V_{BE}$ multiplier circuit is coupled between the base node of the emitter follower and the collector node of the phase splitter. The base to emitter node resistor of the $V_{BE}$ multiplier circuit transistor provides a controlled current source with a voltage of $V_{BE}$ across it. The collector to base node resistor provides the base drive clamp circuit programmable resistor voltage drop in series with the $V_{BE}$ voltage drop of the $V_{BE}$ multiplier circuit transistor. The various "programmable" clamp circuit examples permit selection of the operating region for the phase splitter or other TTL switching transistor element.

According to an alternative example embodiment, the second clamp circuit defines a second clamp circuit path consisting of a stack of voltage drop components between the base node of the emitter follower transistor element and the low potential power rail. In this configuration the second clamp circuit clamps the base node of the emitter follower transistor element at the selected high potential level when the emitter follower transistor element is relatively conducting. To further limit base drive to the phase splitter transistor element in this configuration, a base drive limiting resistor is coupled between the emitter node of the emitter follower transistor element and the base node of the phase splitter transistor element. A base drive diode element may be coupled in parallel with the base drive limiting resistor at the base node of the phase splitter transistor element for providing transient base drive enhancement during turn on of the phase splitter transistor element.

According to any of the second clamp circuit embodiments, the voltage drop components of the second clamp circuit establish a high potential level clamp voltage at the base node of the emitter follower transistor element initially slightly greater than the sum of the voltage drops across the respective base to emitter nodes of the emitter follower transistor element, phase splitter transistor element, and pulldown transistor element. These transistor elements constitute a stack of $V_{BE}$'s when conducting. The voltage level set up initially at the base node of the emitter follower transistor element provides the transient overdrive for high speed switching followed by the base drive current limiting and clamping action of the second clamp circuit.

According to another feature of the invention a threshold hysteresis circuit is coupled to the first clamp circuit for lowering the low potential level clamping voltage and the input threshold voltage level upon transition from a low to high potential level data signal at the input. The higher input threshold voltage level is restored following transition from a high to a low potential level data signal at the input. The input threshold voltage level depression following a low to high potential level transition at the input increases the input noise margin.

In the preferred implementation of the threshold hysteresis circuit, a bypass transistor element is coupled between the first clamp circuit and the low potential power rail for bypassing at least one diode element of the first clamp circuit diode stack when the bypass transistor element is conducting. A bypass control circuit is coupled between the base node of the bypass transistor element and a collector node of the phase splitter transistor element for turning on the bypass transistor element and bypassing a diode element of the first clamp circuit when the phase splitter transistor element is not conducting.

In the illustrated example the bypass control circuit uses a bypass control emitter follower transistor element having a base node coupled to the collector node of the phase splitter transistor element and an emitter node coupled through a bypass control resistor to the base node of the bypass transistor element. A bypass turn off transistor element may be coupled between the base node of the bypass transistor element and the low potential power rail for rapid turn off of the bypass transistor element following a high to low potential level transition at the output. The base node of the bypass turn off transistor element is coupled to the emitter node of the phase splitter transistor element and uses a small portion of the pulldown transistor element base drive current for rapid turn off of the bypass transistor element when the phase splitter transistor element is conducting.

Other objects, features and advantages of the invention are set forth in the following specification and accompanying drawings.

DESCRIPTION OF PREFERRED EXAMPLE EMBODIMENTS AND BEST MODE OF THE INVENTION

Figure 1:
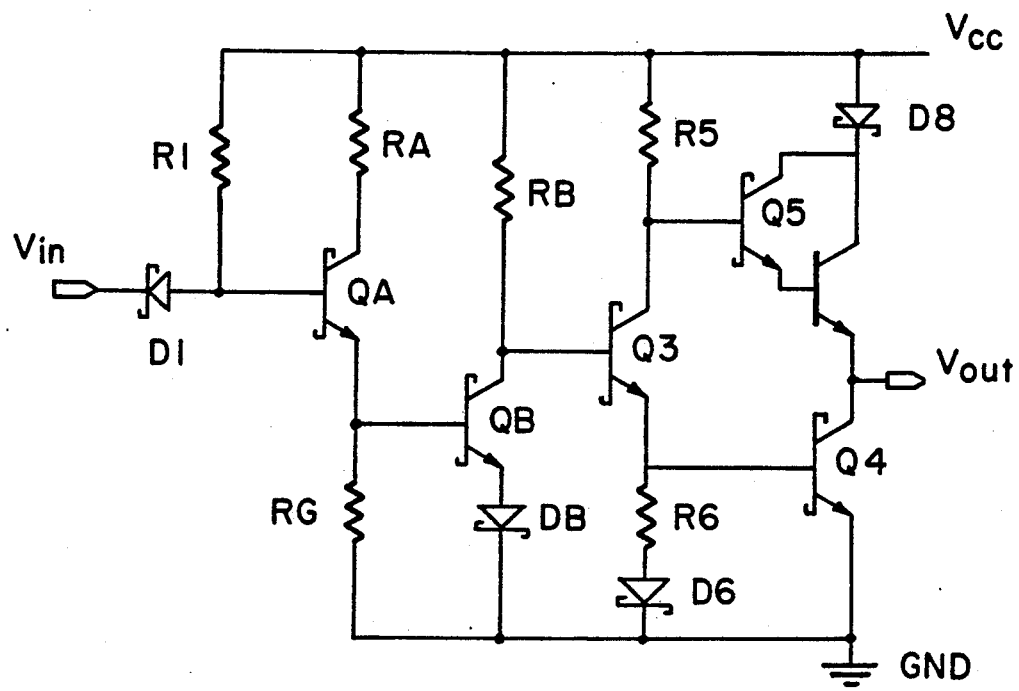
FIG. 1 is a schematic circuit diagram of a prior art non-inverting TTL output buffer circuit.
Figure 2:
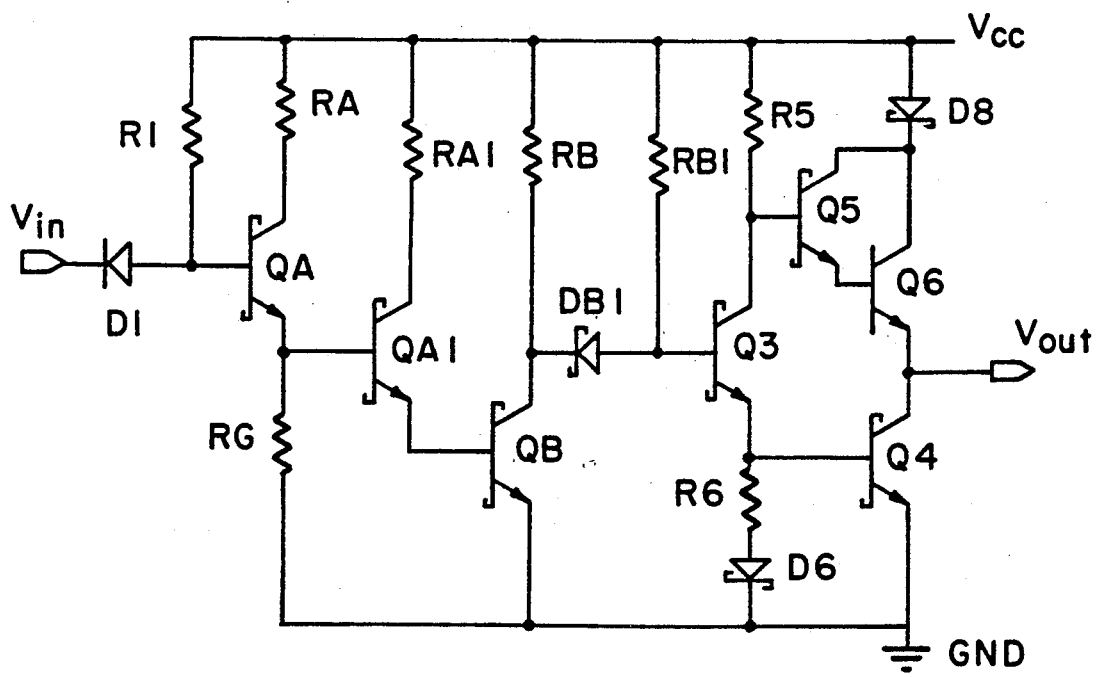
FIG. 2 is a schematic circuit diagram of another prior art TTL output buffer circuit with an additional stage of gain.
Figure 3:
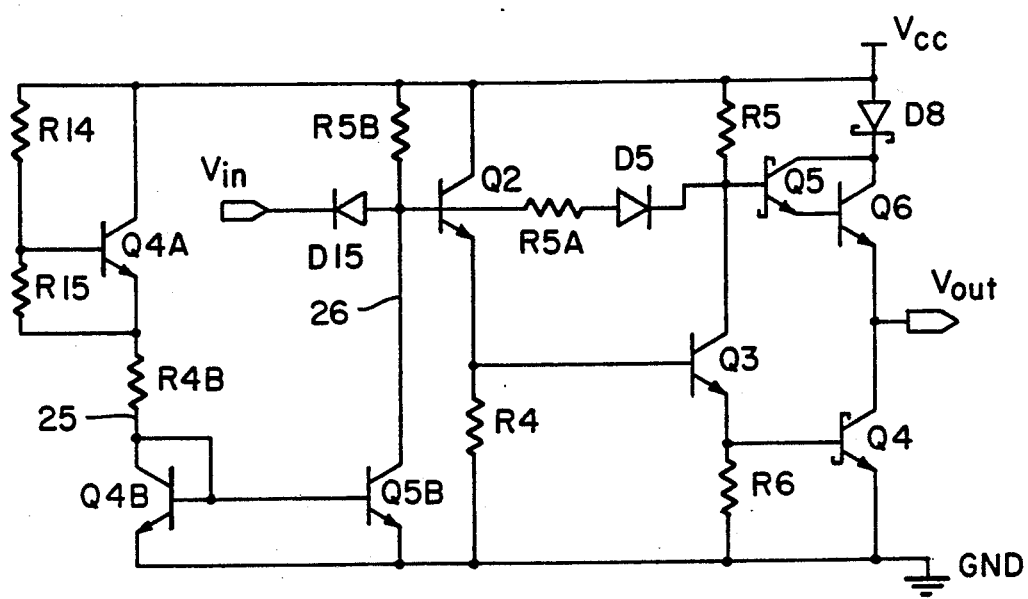
FIG. 3 is a schematic circuit diagram of an inverting TTL buffer circuit from the related U.S. patent application Ser. No. 450,826 filed 11 Dec. 1989 referred to above and incorporating the programmable overdrive and clamp circuit described in the related patent application.
Figure 3A:
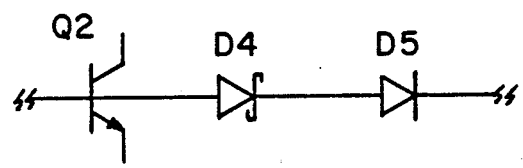
FIG. 3A is a fragmentary portion of the circuit diagram of FIG. 3 showing an alternative embodiment of the overdrive and clamp circuit for the phase splitter transistor element.

A generalized TTL inverting output gate or buffer circuit from the related U.S. patent application Ser. No. 450,826 filed 11 Dec. 1989 referred to above is illustrated in FIGS. 3 and 3A. This circuit incorporates the new overdrive and clamp control circuit which may have broad application for high speed switching and control of TTL switching transistor elements and in this example the phase splitter transistor element Q3. In this example an input signal is applied directly from a host circuit through input diode D15 at the collector node of current mirror transistor element Q5B coupled in a current mirror branch circuit 26. The current mirror branch circuit is the "slave" branch of a current mirror circuit. The branch circuit 26 provides the necessary reference voltage level shift and sets up the desired voltage level across resistor R5B at the base node of emitter follower transistor element Q2. Emitter follower transistor element Q2 provides the base drive current to phase splitter transistor element Q3, initially providing overdrive current for fast turn on of the phase splitter transistor element.

The current flowing in the slave current mirror branch circuit 26 is controlled by the current mirror circuit constant current "master" branch circuit 25. The current mirror circuit which sets up the reference voltage at the base node of emitter follower transistor element Q2 is a non-current switching constant current mirror circuit for high speed signal propagation and high speed voltage level switching at the base node of the emitter follower.

The phase splitter transistor element base drive clamp circuit of the overdrive and clamp circuit is provided by voltage drop components R5A and D5 in the example of FIG. 3. An advantage of this arrangement is that the resistor element R5A is selectable or "programmable" to provide a desired forward bias clamping voltage level across the base collector junction of phase splitter transistor element Q3. The selected clamping voltage level controls operation of the phase splitter transistor element in the desired operating region. An alternative embodiment of the base drive clamp circuit is illustrated in FIG. 3A in which case the node to node clamping voltage drop of the second clamp circuit is fixed, as more fully described in the specification of U.S. patent application Ser. No. 450,826.

In the preferred programmable embodiment of the base drive clamp circuit, the voltage drop across resistor R5A is selected or programmed according to the resistance value of resistor R5A, and the current through resistor R5A set up by the current mirror circuit and resistor R5B. A feature of this overdrive and clamp circuit arrangement is that the emitter follower base drive transistor element Q2 can provide transient overdrive for rapid turn on of transistor element Q3. At the same time the base drive clamp circuit limits operation of the pahse splitter transistor element Q3 to the linear operating region, threshold saturation region or soft saturation region for rapid turn off of phase splitter transistor element Q3. The overdrive and clamp circuit therefore provides general improvement in signal propagation speed for high speed switching.

As explained in the specification of U.S. patent application Ser. No. 450,826 the phrases "deep saturation", "soft saturation operating region" or "soft saturation region", "threshold saturation operating region" or "threshold saturation", and "out of saturation" or "non-saturated operation" or "linear operation" for TTL switching transistor elements are generally intended as follows. "Deep saturation" refers to operation of the TTL switching transistor element with a forward bias or forward voltage drop $V_{BC}$ across the base to collector (B-C) junction of $V_{BC} > \phi$ where $\phi$ is the standard base to emitter (B-E) PN junction voltage drop $V_{BE}$. "Soft saturation" refers to operation with B-C forward bias in the range of approximately $\frac{1}{2}\phi < V_{BC} < \phi$. $V_{BC}$ is closer to $\frac{1}{2}\phi$ for room temperature operation and closer to $\phi$ at high temperature for Schottky clamped TTL transistor elements. Operation with forward bias in the range of $0 < V_{BC} < \frac{1}{2}\phi$ is referred to herein as "threshold saturation" operation, and effectively eliminates charge carrier storage in the base and achieves switching speeds comparable to linear operation. For practical purposes the transistor element is out of saturation and in the linear region in this threshold saturation operating region. In the strict sense, however, "linear operation", "out of saturation" refers to operation of the transistor element with 0 or negative $V_{BC}$.

Figure 4:
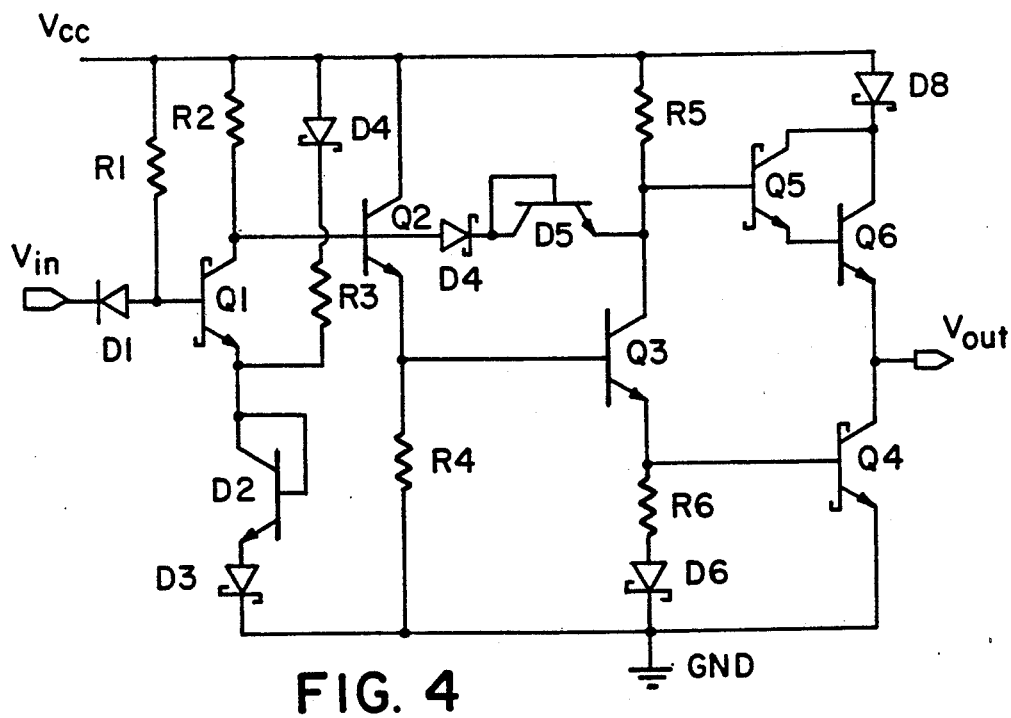
FIG. 4 is a schematic circuit diagram of a non-inverting TTL output buffer circuit according to the invention.

According to the invention the overdrive and clamp circuit of the related patent applications is incorporated in a non-inverting TTL output buffer circuit in a novel circuit configuration as illustrated in FIG. 4. The emitter follower transistor element Q2 again provides the base drive to phase splitter transistor element Q3. The phase splitter Q3 therefore operates in phase with emitter follower Q2. The base node of emitter follower transistor element Q2 however is coupled in an inverting coupling directly to the input stage at the collector node of input transistor element Q1. A non-inverting buffer circuit is therefore provided without the additional inverting stage and additional signal propagation delay conventionally required. At the same time the emitter follower transistor element Q2 can initially provide unlimited base drive current to phase splitter Q3 for high speed switching.

By means of the inverting coupling to the input transistor element Q1, emitter follower transistor Q2 responds out of phase with the input transistor element to input data signals. The voltage limits at the base node of the emitter follower Q2 controlling operation of emitter follower Q2 and phase splitter Q3 are set by first and second clamp circuits. The first clamp circuit which sets the low potential level at the base node of emitter follower Q2 is coupled to the base node of emitter follower Q2 through the input transistor element Q1 and consists of the diode stack D2 and D3.

In this example diode D2 is a base collector shorted (BCS) transistor element providing a voltage drop of 1 $V_{BE}$ across the diode D2. 1 $V_{BE}$ is typically approximately 0.8 v. Diode D3 is a Schottky diode with a voltage drop of 1 $V_{sd}$ across the diode. A Schottky diode voltage drop is typically approximately 0.6 v. Because of the opposite polarity temperature coefficients of D2 and D3, the composite temperature coefficient of the first clamp circuit is somewhat compensated.

With a high potential level data signal appearing at the input $V_{IN}$ the input transistor element Q1 is conducting with a voltage drop of $V_{SAT}$ across the collector to emitter path of the input transistor element approximately equal to 0.2 v. The low potential level applied at the base node of emitter follower Q2 when the input transistor element Q1 is conducting and the emitter follower Q2 is relatively non-conducting, is equal to 1 $V_{SAT}$+1 $V_{BE}$+1 $V_{SD}$ or approximately 1.6 v. This voltage level established by the first clamp circuit also sets the input threshold voltage level at which a high potential data signal at the input turns on the input transistor element Q1.

In order to further reduce temperature dependence of the operation of the input circuit and first clamp circuit of the buffer circuit of FIG. 4, a current biasing circuit consisting of Schottky diode D4 and resistor R3 is coupled between the high potential power rail $V_{CC}$ and the top of the diode stack D2, D3 of the first clamp circuit. Resistor element R3 is relatively large resistance to reduce power dissipation. However, the bias circuit sources sufficient current through diodes D2 and D3 so that when the input voltage passes through the threshold voltage and when the input transistor is turning on, there is sufficient current density for operation of the diodes D2 and D3 in the operating region of lower temperature dependence.

With a low potential level data signal appearing at the input $V_{IN}$, input transistor element Q1 turns off and base drive current sources through resistor R2 to the base of emitter follower transistor element Q2 so that it is relatively conducting. The initial high voltage level at the base node of emitter follower Q2 permits effectively unlimited base drive from the emitter node of emitter follower Q2 to the base of the phase splitter Q3. This overdrive initiates high speed switching of the phase splitter transistor element Q3.

As the phase splitter transistor element Q3 becomes conducting, the second clamp circuit coupled at the base node of emitter follower transistor element Q2 becomes operative setting and limiting the high potential level at the base node of emitter follower Q2. The second clamp circuit consisting of the diode elements D4 and D5 in the example of FIG. 4 effectively provide a base drive limiting clamp circuit operating as a voltage feedback circuit between the collector node of phase splitter transistor element Q3 and the base node of emitter follower Q2. As the phase splitter Q3 begins conducting, the initial high potential level at the collector node of phase splitter Q3 begins falling.

In the example of FIG. 4 it is noted that the second clamp circuit consists of a Schottky diode D4 with voltage drop of 1 $V_{SD}$ and a BCS transistor diode D5 with a voltage drop of 1 $V_{BE}$. The second clamp circuit D4, D5 is part of a voltage feedback loop from the base to emitter nodes of emitter follower Q2 through the base to collector nodes of phase splitter Q3, and back from the collector node of phase splitter Q3 to the base node of emitter follower Q2 through the second clamp circuit D4, D5. The 1 $V_{BE}$ voltage drop across diode D5 offsets the 1 $V_{BE}$ voltage drop across the base to emitter junction of emitter follower Q2 in the voltage feedback loop. The 1 $V_{SD}$ provides an additional clamping voltage drop.

As a result when the potential level at the collector node of phase splitter Q3 falls below 1 $V_{SD}$ above the high potential level at the base node of emitter follower Q2, the second clamp circuit becomes conducting diverting base drive current away from the base node of phase splitter Q3 to the collector node of phase splitter Q3. The second clamp circuit D4, D5 clamps a potential level at the collector node of phase splitter Q3 which effectively limits any forward bias across the base to collector junction of phase splitter Q3 in a desired operating region, for example the soft saturation operating region or the threshold saturation operating region. While the second clamp circuit is described with reference to diodes D4, D5 in the circuit example of FIG. 4, other embodiments of the second clamp circuit such as diodes D4, D7 (FIG. 5), programmable clamp circuit R5A, D5 (FIGS. 6, 7), and the $V_{be}$ multiplier circuit (FIG. 8) may also be incorporated in the non-inverting buffer circuit of FIG. 4 as hereafter described.

In this circuit arrangement the emitter follower transistor element Q2 provides initial overdrive for fast turn on of the phase splitter Q3 but in the context of a novel non-inverting output buffer circuit. The first and second clamp circuits limit and control operation of the emitter follower transistor element Q2 and therefore the phase splitter Q3 within the desired operating region.

Figure 5:
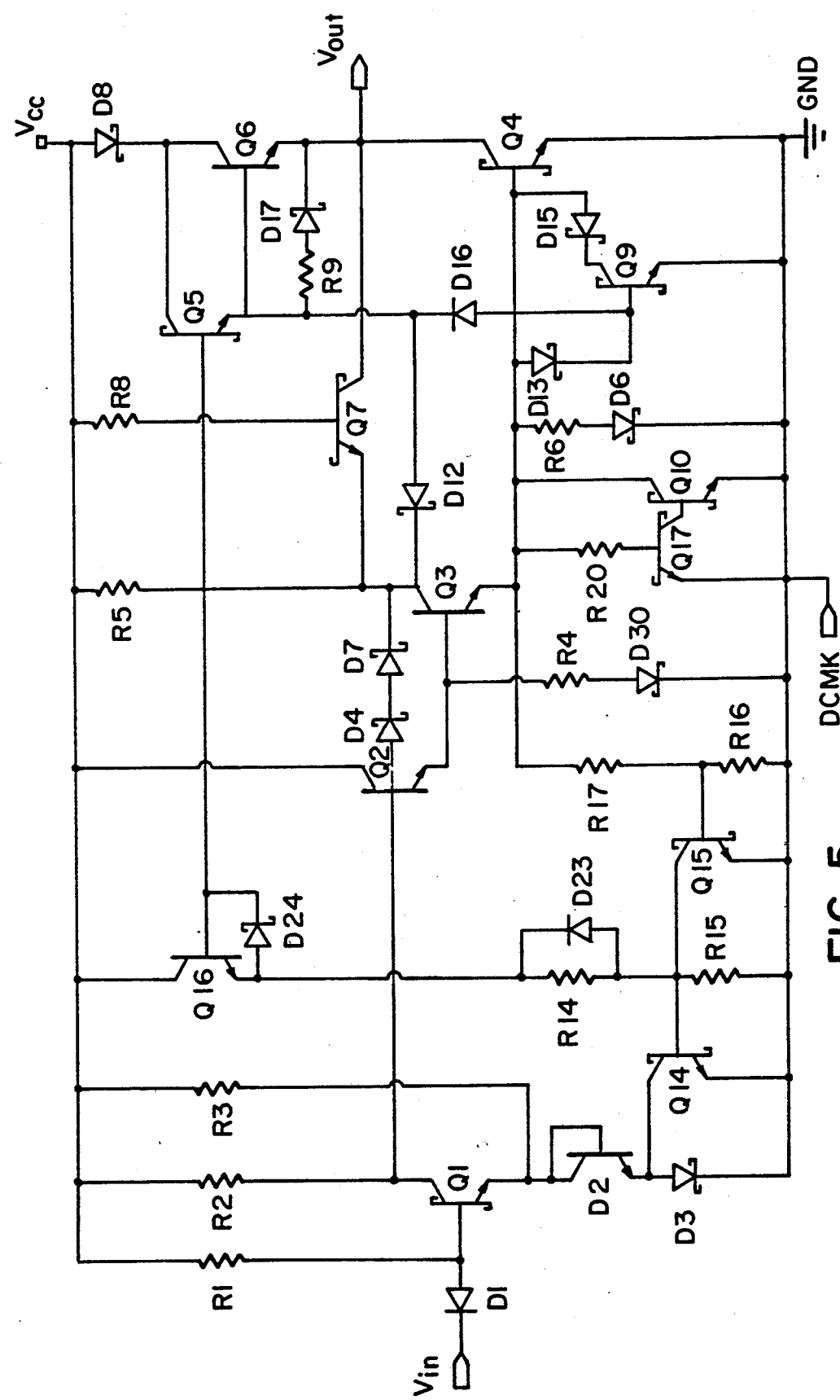
FIG. 5 is a detailed schematic circuit diagram of a non-inverting output buffer circuit line driver incorporating the threshold hysteresis circuit according to the invention.

A further elaboration of the non-inverting TTL output buffer circuit of FIG. 4 is illustrated in FIG. 5. Components performing the same function as in circuit 4 described above are indicated by the same reference designations. In addition there is incorporated into the circuit of FIG. 5 an input threshold hysteresis circuit for improving noise margin at the input $V_{IN}$. This is accomplished by depressing or lowering the input threshold voltage level following a transition from low to high potential level at the input $V_{IN}$ when the emitter follower Q2 becomes relatively non-conducting. With emitter follower Q2 relatively non-conducting, phase splitter Q3 turns off also permitting a high potential level output data signal at the output $V_{OUT}$ in phase with the input data signal.

When phase splitter transistor element Q3 is not conducting a bypass control circuit coupled to the high potential level collector node of phase splitter Q3 becomes conducting. The bypass control circuit emitter follower Q16 conducts current through resistor R14 to the base node of bypass transistor element Q14, turning it on. Bypass transistor element Q14 bypasses a portion of the first clamp circuit D2, D3. In this example the bypass transistor element Q14 bypasses the voltage drop across Schottky diode element D3. When conducting, bypass transistor element Q14 effectively substitutes a voltage drop of 1 $V_{SAT}$, approximately 0.2 v, for the voltage drop across Schottky diode D3 of 1 $V_{SD}$, approximately 0.6 v. The first clamp circuit clamp voltage and input threshold is therefore lowered or depressed by 0.4 v improving the input noise margin by the same amount.

The operation of the bypass control circuit emitter follower Q16 effectively provides a resistor divider with resistors R5 and R14. According to the resistor divider equation, emitter follower Q16 effectively reduces the resistance of resistor R5 to R5/$\beta$ for rapid turn on while isolating the bypass transistor element from the collector of the phase splitter Q3. The base of emitter follower Q16 draws only small current from the collector circuit of phase splitter Q3.

Upon transition from high to low potential level at the input and output of the non-inverting buffer circuit of FIG. 5, it is desirable to shut off the bypass transistor element Q14 quickly to restore the original input threshold voltage level. However the leakage resistor R15 is a large resistor and cannot discharge the base of bypass transistor element Q14 quickly. The bypass turn off transistor element Q15 is therefore provided for active turn off of the bypass transistor element Q14. Upon transition from high to low potential level at the input and output, the base node of bypass turn off transistor element Q15 receives base drive current from the emitter lead of phase splitter Q3. Transistor element Q15 therefore actively and rapidly turns off the bypass transistor element Q14. Upon a further transition at the input and output from low to high potential level the bypass turn off transistor element Q15 is shut down. It is also noted that diode element D23 provides an AC transient current increase supplying enhanced base drive current for turning on the bypass transistor element Q14.

It is noted in the example of FIG. 5 that the second clamp circuit is provided by a pair of series coupled Schottky diodes D4 and D7. Because of the slightly lower voltage drop $V_{SD}$ across a Schottky diode in comparison with a PN junction diode with a voltage drop of $V_{BE}$, the second clamp circuit of FIG. 5 provides a slightly lower base drive clamp voltage level in comparison with the circuit of FIG. 4. In the circuit of FIG. 4, the second clamp circuit of diodes D4 and D5 effectively clamps any forward bias across the base collector junction of phase splitter Q3 to approximately 0.6 v in the soft saturation operating region. In the example of FIG. 5 the second clamp circuit of diodes D4 and D7 effectively clamps any forward bias across the base collector junction of phase splitter Q3 to approximately 0.4 v in the threshold saturation operating region.

The circuit of FIG. 5 also includes a so-called "DC Miller killer" circuit provided by components R20, Q17, Q10 and the DCMK signal input. Such DC Miller killer circuits are described for example in the Ferris et al. U.S. Pat. No. 4,581,550 issued Apr. 8, 1986 and the Ferris U.S. Pat. No. 4,311,927 issued Jan. 19, 1982. A so-called "AC Miller killer" circuit is provided by components Q9, D13, D15, and D16 as described for example in the Bechdolt U.S. Pat. No. 4,321,490 issued Mar. 23, 1982.

Figure 6:
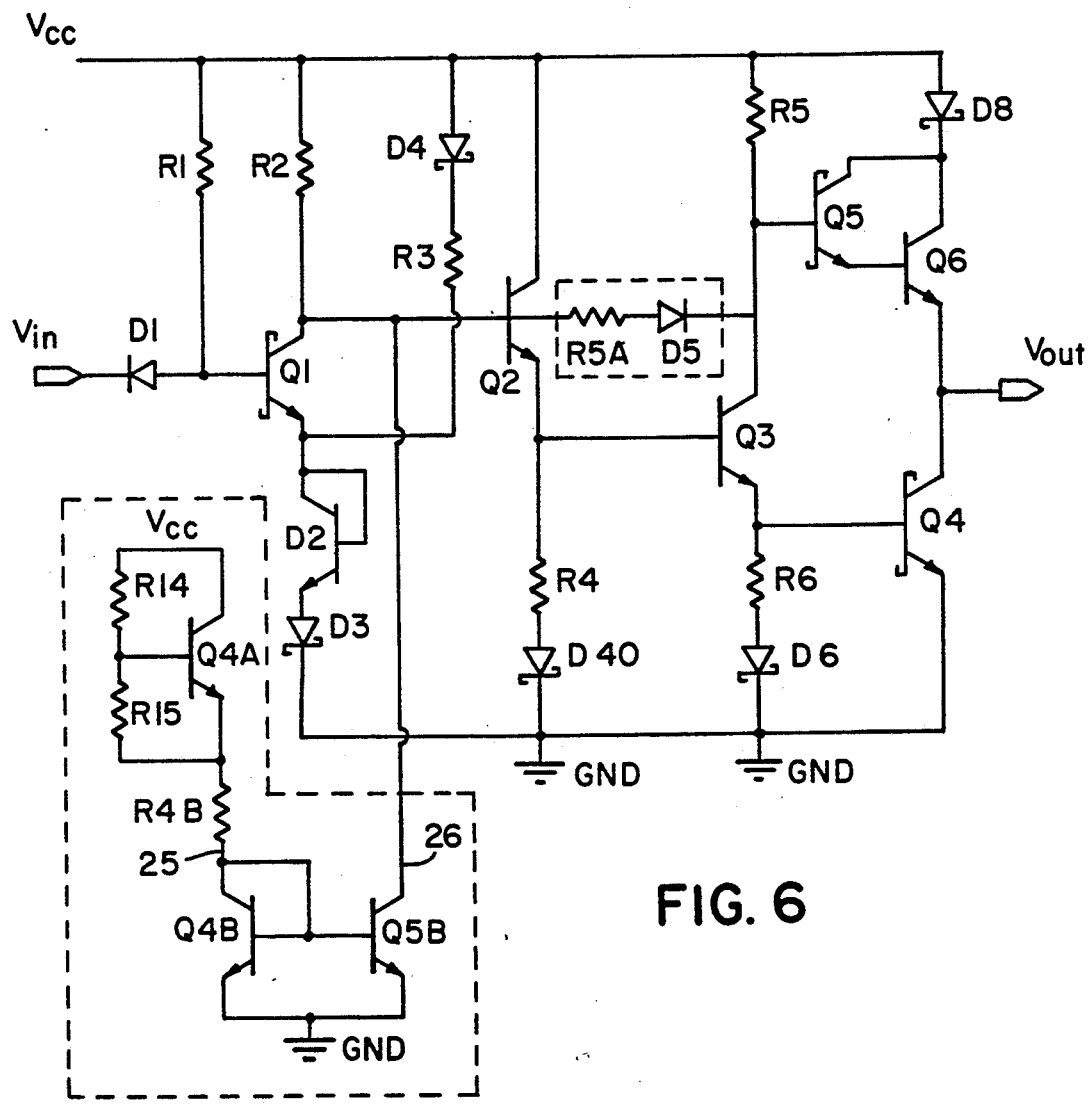
FIG. 6 is a schematic circuit diagram of an inverting output buffer circuit of showing a preferred embodiment for the second clamp circuit providing a "programmable" clamp circuit for controlling operation of the phase splitter transistor element in the desired operating region.

A preferred embodiment of the non-inverting buffer circuit according to the invention in which the second clamp circuit is "programmable" for selecting a desired operating region for phase splitter Q3 is illustrated in FIG. 6. In the preferred example of FIG. 6, the second clamp circuit consists of a "programmable" resistor element R5A and Diode D5. The voltage drop across resistor R5A may be programmed or selected so that the composite clamping voltage drop from node to node across the second clamp circuit R5A, D5 clamps any forward bias across the base to collector junction of phase splitter Q3 for operation of the phase splitter Q3 in the desired operating region.

The voltage drop across the base drive clamp circuit resistor element R5A is of course a function of the resistance value of resistor R5A and the current passing through resistor R5A. The programming or selection of the voltage drop across resistor R5A therefore requires additional circuitry for setting the current passing through resistor R5A at the desired level for achieving the desired voltage drop. To this end the invention provides a reference current source at the base node of emitter follower Q2 which in the example of FIG. 6 is in the form of a current mirror circuit. The current mirror circuit as hereafter described sets up a well defined reference voltage level at the base node of emitter follower Q2 causing the desired current through resistor R5A.

The current mirror circuit of FIG. 6 includes a master current mirror branch circuit 25 and a slave current mirror branch circuit 26. The master current mirror branch circuit 25 sets up a fixed master current in branch circuit 25 which is then mirrored in the slave current mirror branch circuit 26 because of the current mirror configuration coupling of current mirror transistor elements Q4B and Q5B.

The master branch circuit 25 is coupled between the high potential power rail $V_{CC}$ and ground potential power rail. It includes $V_{BE}$ multiplier circuit R14, R15 Q4A, a voltage drop resistor element R4B, and master current mirror transistor element Q4B. The constant current or reference current in the master branch circuit 25 is established according to the voltage drop across resistor element R4B. The voltage drop across resistor R4B is in turn dependent upon the voltage level of high potential power rail $V_{CC}$ and the respective voltage drops across resistor R14, $V_{BE}$ across transistor element Q4A and the $V_{BE}$ across the BCS master current mirror transistor element Q4B. This constant current or reference current is then reflected in the slave current mirror branch circuit 26. The programmed value of this current along with the selected value of resistor R2 determines the reference voltage level established at the base node of emitter follower Q2 and in turn the size of the current passing through resistor R5A of the base drive clamp circuit. In summary, in the example of FIG. 6 programming of the second clamp circuit for operation of the phase splitter Q3 in the desired operating region is achieved by a fixed reference current source establishing a desired reference voltage level at the base node of emitter follower Q2, which determines the current through resistor R5A, which in turn establishes the voltage drop across resistor R5A and the overall clamping voltage of the second clamp circuit.

Figure 7:
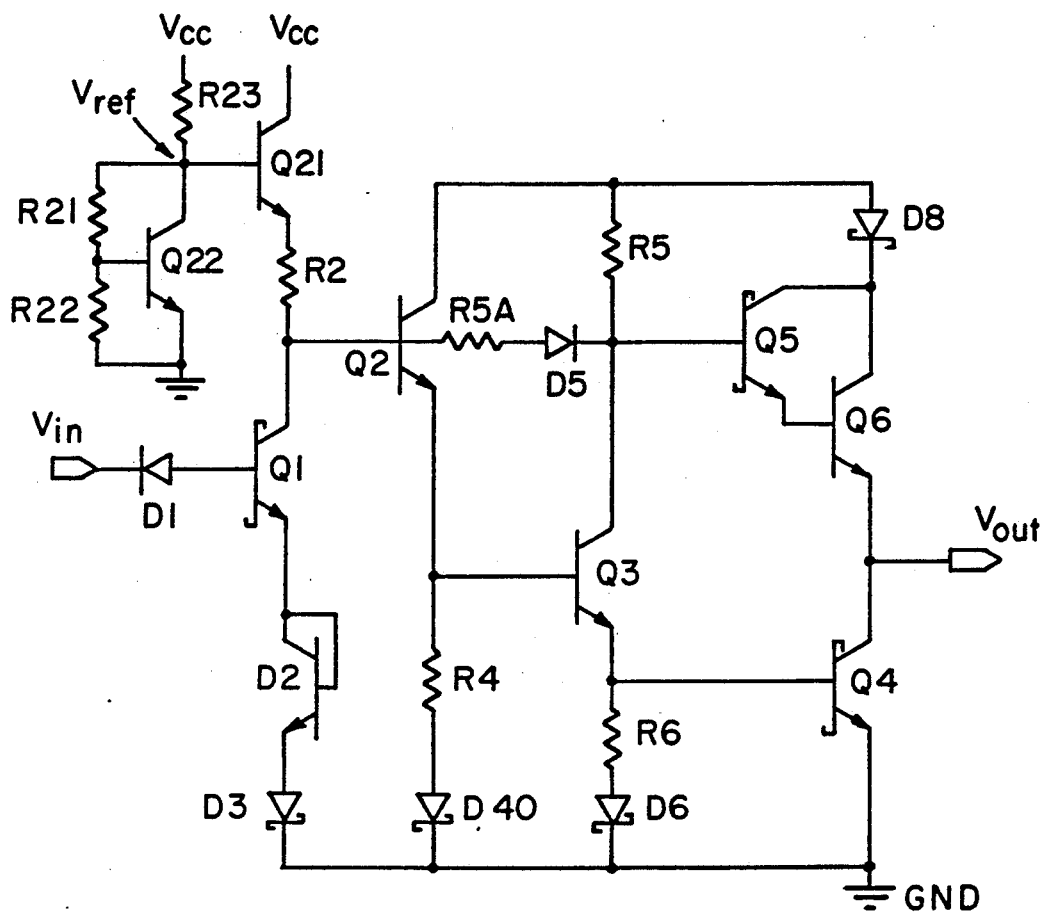
FIG. 7 is a schematic circuit diagram of another non-inverting buffer circuit with a "programmable" base drive limiting second clamp circuit showing an alternative controlled current source at the base node of the emitter follower.

An alternative circuit configuration for establishing the constant current or reference current at the base node of emitter follower Q2 is illustrated in FIG. 7. According to this circuit configuration, a reference current is established by $V_{BE}$ multiplier circuit R21, R22, Q22 coupled between the high potential power rail $V_{CC}$ and the low power rail GND through resistor element R23. The reference current through resistor R23 depends upon the resistance of R23 and the composite voltage drop across the $V_{BE}$ multiplier circuit. The node to node voltage drop across the $V_{BE}$ multiplier circuit is a function of $V_{BE}$ of the form $V_{BE}(1+R21/R22)$.

Base drive current to emitter follower transistor element Q21 is set at a fixed voltage level $V_{ref}$. Emitter follower Q21 therefore in turn operates at a constant current level through emitter resistor R2 to the base of emitter follower Q2 when the input transistor element Q1 is not conducting. The constant reference voltage at the base node of emitter follower Q2 provides a known current through resistor R5A of the base drive clamp circuit for selecting the voltage drop across resistor element R5A and therefore the composite clamping voltage across the second clamp circuit.

In the circuit of FIG. 7, emitter follower transistor element Q21 in effect functions as a pseudorail isolating the reference voltage source $V_{ref}$ from the load on the output $V_{OUT}$. The output load cannot load down the reference voltage source. Emitter follower Q21 therefore acts as the high potential low impedance rail providing a fixed voltage at the Q21 emitter node that follows the constant source $V_{ref}$ but is referenced to ground potential. The $V_{CC}$ rail reference of $V_{ref}$ has been shifted to the ground rail reference at the emitter node Q1.

By way of example, R23 and $V_{BE}(1+R1/R22)$ may be selected so that $V_{ref}=4.5\phi$ v. Voltage at the emitter node of Q21 is therefore approximately 3 v. $V_{R2}$ is selected to be a function of $\phi$, e.g. $V_{R2}=\frac{1}{2}\phi$ v. R5A is "programmable" or selectable as a function of R2 to provide a voltage drop $V_{R5A}$ that is a function of $\frac{1}{2}\phi$, e.g. $V_{R2}=V_{R5A}$. Thus the second clamp circuit is programmed in the example of FIG. 7 by setting the voltage reference $V_{ref}$ and selecting the resistance ratio R2/R5A. The known voltage established across R2 permits the programming of R5A and the voltage drop across the second clamp circuit.

Figure 8:
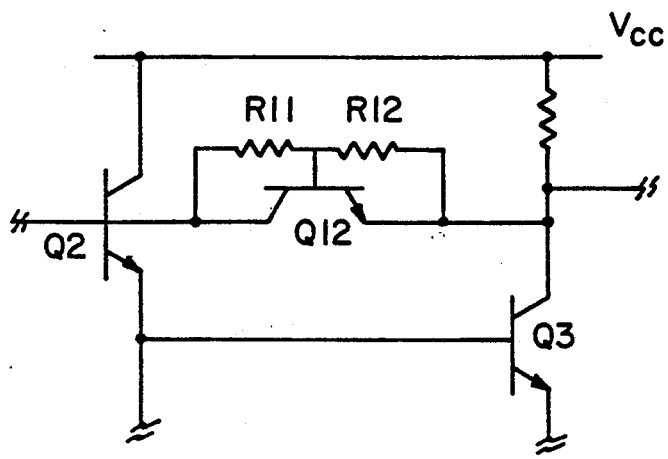
FIG. 8 is detailed fragmentary diagram of another alternative "programmable" base drive limiting second clamp circuit according to the invention.

In the further example of a programmable base drive clamp circuit or second clamp circuit illustrated in FIG. 8, the base drive clamp circuit between the base node of emitter follower Q2 and the collector node of phase splitter Q3 is itself a $V_{BE}$ multiplier circuit R11, R12, Q12. Further analysis of the $V_{BE}$ multiplier circuit as a programmable voltage feedback clamp circuit is as follows. The constant current or reference current source is provided by resistor R12 which is coupled across the fixed voltage drop $V_{BE}$ of the base emitter junction of transistor element Q12. The known resistance of resistor R12 and the known voltage drop across it establish the reference current of this current source. The node to node composite voltage drop across the entire clamp circuit further depends on the resistance value of resistor R11. The composite voltage drop is a function of $V_{BE}$ given by the $V_{BE}$ multiplier circuit equation $V_{BE}(1+R11/R12)$. The clamping voltage is therefore selectable according to the values of R11 and R12 for clamping operation of the phase splitter Q3 in the desired operating region. In the example of FIG. 8, the second clamp circuit sets the current and clamp voltage within the clamp circuit itself. The circuit of FIG. 8 is incorporated in a non-inverting buffer circuit of the kind illustrated in FIG. 4 replacing the second clamp circuit D4, D5.

Figure 9:
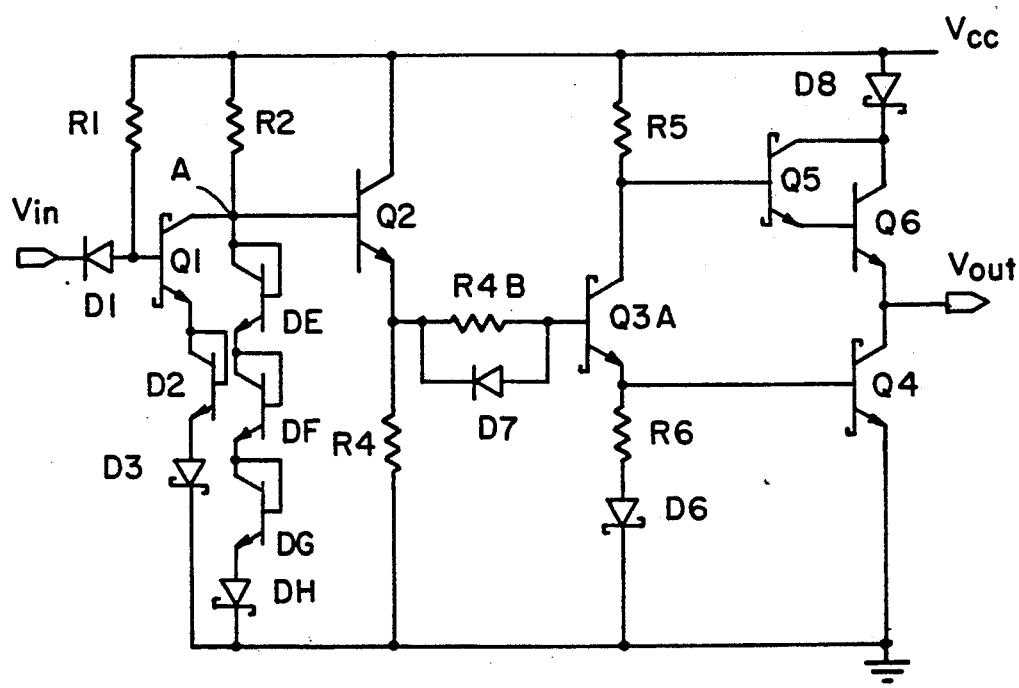
FIG. 9 is a schematic circuit diagram of an alternative embodiment of the non-inverting output buffer circuit according to the invention.

An alternative embodiment of the invention is illustrated in the non-inverting buffer circuit of FIG. 9. In this example the second clamp circuit is coupled not between the base node of emitter follower Q2 and the collector node of phase splitter transistor element Q3A, but instead between the base node of emitter follower Q2 and the low potential power rail GND. As illustrated in FIG. 9 the second clamp circuit consists of a diode stack DE, DF, DG and DH which sets the high potential level at the base node of emitter follower Q2 when emitter follower Q2 is relatively conducting. This high potential clamp voltage level is set to be slightly greater than $3V_{BE}$ when transistor elements Q2, Q3A and Q4 are turning on for providing initial overdrive by the emitter follower Q2. Without the base drive clamp circuit of FIGS. 4-8, the base drive to phase splitter Q3A is limited by base drive limiting resistor R4B. Diode D7 provides a capacitive coupling around the base drive limiting resistor R4B for initial base drive current transient enhancement and initial fast turn on of the phase splitter Q3A.

While the invention has been described with reference to particular example embodiments it is intended to cover all modifications and equivalents within the scope of the following claims.

We claim:

1. A TTL non-inverting buffer circuit having an input for receiving input data signals at high and low potential levels and an output for transmitting data signals, an input transistor circuit coupled to the input, pulldown transistor element coupled to the output for sinking current from the output to a low potential power rail, a pullup circuit coupled to the output for sourcing current to the output from a high potential power rail, and a phase splitter transistor element coupled to control in opposite phase the conducting states of the pullup circuit and pulldown transistor element comprising:

an input transistor element having a base node coupled to the input;

an emitter follower transistor element having a base node coupled to a collector node of the input transistor element and an emitter node coupled to a base node of the phase splitter transistor element for sourcing base drive current to the phase splitter transistor element in response to data signals at the input;

a first clamp circuit means comprising a plurality of voltage drop components coupled between the emitter node of the input transistor element and the low potential power rail defining a first clamp circuit path between the base node of the emitter follower transistor element through the input transistor element to the low potential power rail for clamping the base node of the emitter follower transistor element at a low potential level when the emitter follower transistor element is relatively non-conducting following transition from a low to a high potential level data signal at the input and for establishing the input threshold voltage level for switching of the input transistor element;

and a second clamp circuit means comprising a plurality of voltage drop components coupled between the base node of the emitter follower transistor element and the collector node of the phase splitter transistor element providing a voltage feedback circuit between the emitter follower and phase splitter transistor elements for limiting base drive current to the phase splitter transistor element from the emitter follower transistor element and thereby limiting saturation of the phase splitter transistor element when the emitter follower transistor element is relatively conducting following transition from a high to a low potential level data signal at the input.

2. The TTL buffer circuit of claim 1 further comprising a threshold hysteresis circuit means coupled to the first clamp circuit means for lowering the input threshold voltage level upon transition from low to high potential level at the input for increasing the input noise margin, and for restoring the higher input threshold voltage level upon transition from high to low potential level at the input, said threshold hysteresis circuit means comprising a bypass transistor element coupled to the first clamp circuit means for bypassing at least one voltage drop component of the first clamp circuit means when the bypass transistor element is conducting, and a bypass control circuit operatively coupled between the base node of the bypass transistor element and a collector node of the phase splitter transistor element for turning on the bypass transistor element when the phase splitter transistor element is not conducting following transition from a low to a high potential level data signal at the input.

3. The TTL non-inverting buffer circuit of claim 2 wherein the bypass control circuit further comprises a bypass turn off transistor element coupled between the base node of the bypass transistor element and the low potential power rail for rapid turn off of the bypass transistor element, said bypass turn off transistor element having a base node operatively coupled to the emitter node of the phase splitter transistor element for rapid turn off of the bypass transistor element when the phase splitter transistor element is conducting following transition from a high to a low potential level data signal at the input.

4. The TTL non-inverting buffer circuit of claim 1 further comprising a current source bias circuit coupled to the voltage drop components of the first clamp circuit means for biasing the voltage drop components and maintaining a current density level through the voltage drop components for reducing the temperature dependence of the voltage drop across said voltage drop components.

5. The TTL non-inverting buffer circuit of claim 1 wherein the second clamp circuit means comprises a "programmable" clamp circuit including a resistor voltage drop component having selected resistance value and a diode voltage drop component, and further comprising a controlled current source coupled to the base node of the emitter follower transistor element for setting the current through the resistor voltage drop component.

6. The TTL non-inverting buffer circuit of claim 5 wherein the controlled current source comprises a non-current switching, constant current, current mirror circuit.

7. The TTL non-inverting buffer circuit of claim 5 wherein the second clamp circuit comprises a $V_{BE}$ multiplier circuit.

8. A TTL non-inverting buffer circuit having an input for receiving data signals at high and low potential levels and an output for transmitting data signals, an input transistor circuit coupled to the input, a pulldown transistor element coupled to the output for sinking current from the output to a low potential power rail, a pullup circuit coupled to the output for sourcing current to the output from a high potential power rail, and a phase splitter transistor element coupled to control in opposite phase the conducting states of the pullup circuit and the pulldown transistor element comprising:

an input transistor element having a base node coupled to the input;
an emitter follower transistor element having a base node coupled to a collector node of the input transistor element and an emitter node coupled to a base node of the phase splitter transistor element for sourcing base drive current to the phase splitter transistor element in response to data signals at the input;

a first clamp circuit means comprising voltage drop components coupled between the emitter node of the input transistor element and the low potential power rail defining a first clamp circuit path from the base node of the emitter follower transistor element through the input transistor element to the low potential power rail for clamping the base node of the emitter follower transistor element at a low potential level when the emitter follower transistor element is relatively non-conducting following transition from a low to a high potential level data signal at the input and for establishing the input threshold voltage level for turn on of the input transistor element;

a second clamp circuit means comprising voltage drop components coupled between the base node of the emitter follower transistor element and the low potential power rail for clamping the base node of the emitter follower transistor element at a high potential level at said base node when the emitter follower transistor element is relatively conducting following transition from a high to a low potential level data signal at the input; and a base drive limiting resistor coupled between the emitter node of the emitter follower transistor element and the base node of the phase splitter transistor element for limiting base drive current to the phase splitter transistor element from the emitter follower transistor element thereby limiting saturation of the phase splitter transistor element.

9. The TTL non-inverting buffer circuit of claim 8 further comprising a base drive diode element coupled in parallel with the base drive limiting resistor for providing transient enhancement of base drive current to the phase splitter transistor element following transition from a high to low potential level data signal at the input.

10. The TTL non-inverting buffer circuit of claim 9 further comprising a current source bias circuit coupled to the first clamp circuit means for biasing the voltage drop components and maintaining a current density level through the voltage drop components for reducing the temperature dependence of the voltage drop across said voltage drop components.

11. The TTL non-inverting buffer circuit of claim 8 further comprising a threshold hysteresis circuit means coupled to the first clamp circuit means for lowering the input threshold voltage level upon transition from a low to a high potential level data signal at the input for increasing the input noise margin, and for restoring the higher input threshold voltage level following transition from a high to a low potential level data signal at the input.

12. A TTL buffer circuit having an input for receiving data signals at high and low potential levels and an output for transmitting data signals, an input transistor circuit having a base node, collector node, and emitter node, said base node being coupled to the input, a pulldown transistor element coupled to the output for sinking current from the output to a low potential power rail, pullup means coupled to the output for sourcing current to the output from a high potential power rail, and a phase splitter transistor element coupled to control in opposite phase the conducting states of the pullup means and pulldown transistor element comprising:

an emitter follower transistor element having a base node coupled to a collector node of the input transistor circuit and an emitter node coupled to a base node of the phase splitter transistor element for sourcing base drive current to the phase splitter transistor element in response to data signals at the input;

first clamp circuit means defining a first clamp circuit path between the base node of the emitter follower transistor element and the low potential power rail for clamping said base node at a low potential level when the emitter follower transistor element is relatively non-conducting and for establishing the input threshold voltage level for switching of the input transistor circuit;

and second clamp circuit means coupled to the base node of the emitter follower transistor element defining a second clamp circuit path clamping said base node at a high potential level for limiting base drive current to the phase splitter transistor element from the emitter follower transistor element when the emitter follower transistor element is relatively conducting, for limiting saturation of the phase splitter transistor element, and for improving switching speed of the TTL buffer circuit.

13. The TTL buffer circuit of claim 12 wherein the first clamp circuit means is coupled between an emitter node of the input transistor circuit and the low potential power rail, said first clamp circuit means being coupled to the base node of the emitter follower transistor element through said input transistor circuit.

14. The TTL buffer circuit of claim 12 wherein the first clamp circuit means comprises first and second diode elements coupled in series between the emitter node of the input transistor circuit and said low potential power rail.

15. The TTL buffer circuit of claim 14 further comprising a current source bias circuit coupled to the first clamp circuit means for biasing the diode elements and maintaining a current density level through the diode elements for reducing the temperature dependence of the voltage drop across said diode elements.

16. The TTL buffer circuit of claim 14 wherein the first and second diode elements of the first clamp circuit means comprise respectively a BCS transistor element diode and a Schottky diode for reducing the composite temperature coefficient of the first clamp circuit means.

17. The TTL buffer circuit of claim 14 further comprising a threshold hysteresis circuit means coupled to the first clamp circuit means for lowering the input threshold voltage level upon a first transition of data signal potential levels at the input for increasing the input noise margin, and for restoring the higher input threshold voltage level upon a second transition of data signal potential levels at the input.

18. The TTL buffer circuit of claim 17 wherein the threshold hysteresis circuit means comprises a bypass transistor element operatively coupled between the first clamp circuit means and the low potential power rail for bypassing at least one diode element of the first clamp circuit means when the bypass transistor element is conducting, and a bypass control circuit coupled between the base node of the bypass transistor element and a collector node of the phase splitter transistor element for turning on the bypass transistor element and bypassing a diode element of the first clamp circuit means when the phase splitter transistor element is not conducting.

19. The TTL buffer circuit of claim 18 wherein the bypass control circuit comprises a bypass control emitter follower transistor element having a base node coupled to the collector node of the phase splitter transistor element and an emitter node coupled through a bypass control resistor to the base node of the bypass transistor element.

20. The TTL buffer circuit of claim 19 wherein the bypass control circuit further comprises a bypass control diode element coupled in parallel with the bypass control resistor for providing transient increase in base drive current for turning on the bypass transistor element during said first transition of data signal potential levels at the input, wherein the phase splitter transistor element is coupled to the high potential power rail through a collector resistor, and wherein the phase splitter transistor element collector resistor and the bypass control resistor form a resistor divider for controlling the bypass transistor element.

21. The TTL buffer circuit of claim 19 wherein the bypass control circuit further comprises a bypass turn off transistor element coupled between the base node of the bypass transistor element and the low potential power rail for rapid turn off of the bypass transistor element, said bypass turn off transistor element having a base node operatively coupled to the emitter node of the phase splitter transistor element for rapid turn off of the bypass transistor element when the phase splitter transistor element is conducting following a selected data signal potential level transition at the input.

22. The TTL buffer circuit of claim 12 wherein the second clamp circuit means defines a second clamp circuit path coupled between the base node of the emitter follower transistor element and a collector node of the phase splitter transistor element providing a voltage feedback circuit between the emitter follower and phase splitter transistor elements for limiting base drive current to the phase splitter transistor element from the emitter follower transistor element.

23. The TTL buffer circuit of claim 22 wherein the second clamp circuit means comprises first and second diode elements coupled in series between the emitter follower transistor element base node and the phase splitter transistor element collector node.

24. The TTL buffer circuit of claim 23 wherein the first and second diode elements of the second clamp circuit means comprise respectively first and second Schottky diodes.

25. The TTL buffer circuit of claim 23 wherein the first and second diode elements of the second clamp circuit means comprise respectively a Schottky diode and a PN junction diode.

26. The TTL non-inverting buffer circuit of claim 22 wherein the second clamp circuit means comprises a "programmable" clamp circuit including a resistor voltage drop component having selected resistance value and a diode voltage drop component, and further comprising a controlled current source coupled to the base node of the emitter follower transistor element for setting the current through the resistor voltage drop component.

27. The TTL non-inverting buffer circuit of claim 26 wherein the controlled current source comprises a non-current switching, constant current, current mirror circuit.

28. The TTL non-inverting buffer circuit of claim 26 wherein the second clamp circuit comprises a $V_{BE}$ multiplier circuit.

29. The TTL buffer circuit of claim 12 wherein the second clamp circuit means defines a second clamp circuit path between the base node of the emitter follower transistor element and the low potential power rail for clamping the base node of the emitter follower transistor element at a high potential level when the emitter follower transistor element relatively conducting, and further comprising a base drive limiting resistor coupled between the emitter node of the emitter follower transistor element and the base node of the phase splitter transistor element.

30. The TTL buffer circuit of claim 29 wherein the second clamp circuit means comprises a plurality of series coupled voltage drop components establishing a high potential level clamp voltage at the base node of the emitter follower transistor element slightly greater than the sum of the voltage drops across the respective base to emitter nodes of the emitter follower transistor element, phase splitter transistor element, and pulldown transistor element.

31. The TTL buffer circuit of claim 29 further comprising a base drive diode element coupled in parallel with the base drive limiting resistor at the base node of the phase splitter transistor element for providing transient base drive enhancement for turn on of the phase splitter transistor element during said second transition of data signal potential levels at the input.

* * * * *